US007326473B2

(12) United States Patent
Kido et al.

(10) Patent No.: US 7,326,473 B2
(45) Date of Patent: *Feb. 5, 2008

(54) ORGANIC ELECTROLUMINESCENT DEVICES

(75) Inventors: Junji Kido, 9-4-3, Umamikita Kouryou-cho, Kitakatsuragi-gun, Nara-ken (JP); Tokio Mizukami, Kanagawa-ken (JP); Jun Endoh, Kanagawa-ken (JP)

(73) Assignees: Junji Kido, Nara-ken (JP); International Manufacturing and Engineering Services Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/274,752

(22) Filed: Oct. 21, 2002

(65) Prior Publication Data

US 2003/0072967 A1   Apr. 17, 2003

Related U.S. Application Data

(63) Continuation of application No. 09/250,205, filed on Feb. 16, 1999, now abandoned.

(30) Foreign Application Priority Data

Feb. 17, 1998   (JP) .................................. 10-34599

(51) Int. Cl.
    *H01L 51/50* (2006.01)
(52) U.S. Cl. ...................... 428/690; 428/917; 313/504; 313/506
(58) Field of Classification Search ................ 428/690, 428/917, 332, 457; 313/504, 506
    See application file for complete search history.

(56) References Cited

U.S. PATENT DOCUMENTS 4,356,429 A   10/1982   Tang .......................... 313/503

(Continued)

FOREIGN PATENT DOCUMENTS

EP   0 616 488 A2   9/1994

(Continued)

OTHER PUBLICATIONS

"The Production of Metallic Calcium by Thermal Reduction", C.C Loomis, pp. 207-216, Apr. 17, 1946.

(Continued)

*Primary Examiner*—Dawn L. Garrett
(74) *Attorney, Agent, or Firm*—McCormick, Paulding & Huber LLP

(57) ABSTRACT

An organic electroluminescent (EL) device comprising at least one luminescent layer of an organic compound, the luminescent layer being positioned between a cathode electrode and an anode electrode opposed to the cathode electrode, and an organic layer positioned adjacent to the cathode electrode, in which the organic layer is constituted from an organic metal complex compound containing at least one of alkali metal ions, alkali earth metal ions and rare earth metal ions, and the cathode electrode is constituted from a metal capable of reducing the metal ion in the complex compound, in vacuum, to the corresponding metal. The cathode electrode can be formed from a low cost and stable metal which is well-known as the wiring material. The EL device ensures a diminished energy barrier in an electron injection from the cathode electrode into the luminescent layer, a lowered driving voltage, and a high efficiency and luminescence.

10 Claims, 3 Drawing Sheets

U.S. PATENT DOCUMENTS

| | | | |
|---|---|---|---|
| 4,539,507 A | 9/1985 | VanSlyke et al. | 313/504 |
| 4,720,432 A | 1/1988 | VanSlyke et al. | 428/457 |
| 4,769,292 A * | 9/1988 | Tang et al. | 428/690 |
| 4,885,211 A | 12/1989 | Tang et al. | 428/457 |
| 5,059,862 A | 10/1991 | VanSlyke et al. | 313/503 |
| 5,247,190 A | 9/1993 | Friend et al. | 257/40 |
| 5,456,988 A * | 10/1995 | Sano et al. | 428/690 |
| 5,457,565 A * | 10/1995 | Namiki et al. | 359/273 |
| 5,458,977 A | 10/1995 | Hosokawa et al. | 428/411.1 |
| 5,529,853 A * | 6/1996 | Hamada et al. | 428/690 |
| 5,693,428 A * | 12/1997 | Fujii et al. | 428/690 |
| 5,719,467 A | 2/1998 | Antoniadis et al. | 313/506 |
| 5,739,635 A * | 4/1998 | Wakimoto | 313/504 |
| 5,759,444 A * | 6/1998 | Enokida et al. | 252/301.16 |
| 5,891,554 A | 4/1999 | Hosokawa et al. | 428/212 |
| 5,909,081 A | 6/1999 | Eida et al. | 313/504 |
| 5,981,092 A | 11/1999 | Arai et al. | 428/690 |
| 5,989,737 A | 11/1999 | Xie et al. | 428/690 |
| 6,013,384 A | 1/2000 | Kido et al. | 428/690 |
| 6,028,327 A | 2/2000 | Mizoguchi et al. | 257/98 |
| 6,396,209 B1 * | 5/2002 | Kido et al. | 313/504 |
| 6,423,429 B2 | 7/2002 | Kido et al. | 428/690 |
| 6,589,673 B1 | 7/2003 | Kido et al. | 428/690 |
| 2002/0045061 A1 | 4/2002 | Hosokawa | 428/690 |
| 2003/0044645 A1 | 3/2003 | Kambe et al. | 428/690 |

FOREIGN PATENT DOCUMENTS

| | | |
|---|---|---|
| EP | 0373582 B1 | 3/1995 |
| EP | 0388768 B1 | 8/1995 |
| EP | 0 855 848 A2 | 7/1998 |
| EP | 0 948 063 A2 | 10/1999 |
| EP | 1 017 118 A2 | 7/2000 |
| EP | 1 089 597 A1 | 4/2001 |
| EP | 1 351 558 A1 | 10/2003 |
| JP | 59-194393 | 11/1984 |
| JP | 63-295695 | 12/1988 |
| JP | 2-88689 | 3/1990 |
| JP | 2-191694 | 7/1990 |
| JP | 2-196885 | 8/1990 |
| JP | 2-250292 | 10/1990 |
| JP | 2-252793 | 10/1990 |
| JP | 2-255789 | 10/1990 |
| JP | 2-289676 | 11/1990 |
| JP | 3-231970 | 10/1991 |
| JP | 03-269084 | 11/1991 |
| JP | 3-296595 | 12/1991 |
| JP | 4-96990 | 3/1992 |
| JP | 04 137485 | 5/1992 |
| JP | 04 328295 | 11/1992 |
| JP | 5-9470 | 1/1993 |
| JP | 5-17764 | 1/1993 |
| JP | 5-202011 | 8/1993 |
| JP | 05 331458 | 12/1993 |
| JP | 6-25659 | 2/1994 |
| JP | 6-49079 | 2/1994 |
| JP | 6-88072 | 3/1994 |
| JP | 6-100857 | 4/1994 |
| JP | 6-107648 | 4/1994 |
| JP | 6-92947 | 5/1994 |
| JP | 6-132080 | 5/1994 |
| JP | 6-145146 | 5/1994 |
| JP | 6-203963 | 7/1994 |
| JP | 6-206865 | 7/1994 |
| JP | 6-207170 | 7/1994 |
| JP | 6-215874 | 8/1994 |
| JP | 6-279322 | 10/1994 |
| JP | 6-279323 | 10/1994 |
| JP | 6-293778 | 10/1994 |
| JP | 7-97355 | 4/1995 |
| JP | 7-101911 | 4/1995 |
| JP | 7-126225 | 5/1995 |
| JP | 7-126226 | 5/1995 |
| JP | 8-40997 | 5/1995 |
| JP | 7-145116 | 6/1995 |
| JP | 7-157473 | 6/1995 |
| JP | 7-179394 | 7/1995 |
| JP | 7-188130 | 7/1995 |
| JP | 7-224012 | 8/1995 |
| JP | 7-228579 | 8/1995 |
| JP | 7-278124 | 10/1995 |
| JP | 8-22557 | 1/1996 |
| JP | 8-40995 | 2/1996 |
| JP | 8-40996 | 2/1996 |
| JP | 8-48656 | 2/1996 |
| JP | 8-81472 | 3/1996 |
| JP | 08-167475 | 6/1996 |
| JP | 08-222374 | 8/1996 |
| JP | 08-306489 | 11/1996 |
| JP | 09-120890 | 5/1997 |
| JP | 09-165391 | 6/1997 |
| JP | 09272865 | 10/1997 |
| JP | 10 050480 | 2/1998 |
| JP | 10-270171 | 10/1998 |
| JP | 11-120894 | 4/1999 |
| JP | 11-121176 | 4/1999 |
| JP | 11-233262 | 8/1999 |
| JP | 11 251067 | 9/1999 |
| JP | 2000-182774 | 6/2000 |
| JP | 2001-102175 | 4/2001 |
| JP | 2001-142627 | 5/2001 |
| JP | 2001-244079 | 9/2001 |
| JP | 2002-86599 | 3/2002 |
| JP | 2002-332567 | 11/2002 |
| JP | 2003-272860 | 9/2003 |

OTHER PUBLICATIONS

"A Lithium Carboxylate Ultrathin Film on an Aluminum Cathode for Enhanced Electron Injection in Organic Electroluminescent Devices". C. Ganzorig and M. Fujihira, Jpn. J. Appl. Phys. vol. 38 (1999), pp. L1348-L1350, Dec. 4-7, 2000.

"Interface engineering in organic electroluminescent devices", L. S. Hung and M. G. Mason, Proceedings of the 10th International Workshop on Inorganic and Organic Electroluminescence (EL'00), pp. 47-56.

Organic EL Devices Doped With a Quinacridone Derivative Showing Higher Brightness and Luminescent Efficiency, Pioneer Electronic Corp. Corporate R & D Lab, Murayama et al., 29P-2C-15, (no page # or date).

High Bright Organic Thin Film EL Devices Using a Li Alloy Cathode, Toppan Printing Co., Ltd. Y. Itoh et al., (no date), p. 1040, 28a-PB-4.

A Calcium Oxide Can be Reduced by Aluminum, Chemical Handbook, p. 369, (no date).

Metal Handbook p. 88, "Rubidium" and "Cesiums", (no date).

Metal Handbook p. 87, "Li", (no date).

Polymer Light-Emitting Electrochemical Cells (Science vol. 269 Aug. 25, 1995 p. 1086-1089.

Physical Review Letters (vol. 14, No. 7) dated Feb. 15, 1965 p. 228-231.

IEEE Transactions on Electron Devices (vol. 40, No. 7) dated Jul. 1993 pp. 1342-1343, 1344, 1348, and 1349.

Organic Electroluminescent Diodes by C.W. Tang and S.A. VanSlyke, Appl. Phys Lett. 51(12) dated Sep. 21, 1987 pp. 913-915.

Society for Information Display International Symposium Digest of Technical Papers (Vol. XXVIII), May 13-18, 1997 pp. 775-777.

Organic EL Cells Using Alkaline Metal Compounds as Electron Injection Materials by T. Wakimoto, Y. Fukuda, K. Nagayama, A. Yokoi, H. Nakada, and M. Tsuchida, vol. 44 No. 8, dated Aug. 1997 pp. 1245-1247.

"Electroluminescence from Polyvinylcarbazole films: 1. Carbazole cations" Partridge, R.H., POLYMER, 1983, vol. 24, June, pp. 733-738.

"Electroluminescence from Polyvinylcarbazole films: 2. Polyvinylcarbazole films containing antimony pentachloride" Partridge, R.H., POLYMER, 1983, vol. 24, June, pp. 739-747.

"Electroluminescence from Polyvinylcarbazole films: 3. Electroluminescent devices" Partridge, R.H., POLYMER, 1983, vol. 24, June, pp. 748-754.

"Electroluminescence from Polyvinylcarbazole films: 4. Electroluminescence using higher work function cathodes" Partridge, R.H., POLYMER, 1983, vol. 24, June, pp. 755-762.

Zugang L et al.: "Effects of microcavities on the spontaneous emission of organic light-emitting diodes with ZnO:Al as the anode" J. Phys.: Condensed Matter, 1998, vol. 10, pp. 6019-6025, XP-000964847.

S. K. So, et al.: "Interference effects in bilayer organic light-emitting diodes", Applied Physics Letters, Apr. 5, 1999, vol. 74, No. 14, pp. 1939-1941, XP-000827174.

"Vertical-Cavity Organic Light-Emitting Diode Display", IBM Technical Disclosure Bulletin, Sep. 1997, vol. 40, No. 09, pp. 165-167, XP-000735697.

Berggren M. et al.: "Polymer light-emitting diodes placed in microcavities", Synthetic Metals 76, 1996, pp. 121-123, XP-000992227.

Junji Kido & Toshio Matsumoto,"Bright OrganicElectroluminescent Devices Having a Metal-Doped Electron-Injecting Layer", Applied Physics Letters, vol. 73, No. 20, Nov. 16, 1998, pp. 2866-2868.

CRC Handbook of Chemistry and Physics, 64th Edition, CRC Press, Inc., 1983-1984, pp. E-76-E-77.

Kido, J. and Matsumoto, T., "29.1: Invited Paper; Bright Organic EL Devices Having Metal-Doped Electron-Injecting Layer", SID 97 DIGEST, pp. 775-777, May 1997.

English Language Translation of Japanese Office Action and Japanese Office Action for corresponding Japanese Patent Application No. H10-034599, dated Sep. 20, 2006.

English Language Translation of Japanese Office Action and Japanese Office Action for corresponding Japanese Patent Applicaton No. H10-034599, dated May 21, 2007.

Toppan Printing Co. (cf. 51st. Periodical Meeting, Japanese Society of Applied Physics, Preprint 28a-PB-4 p. 1040.

Pioneer Co. (cf. 54th Periodical Meeting, Japanese Society of Applied Physics, Preprint 29p-ZC-15 p. 1127), no date.

"Bright Organic Electroluminescent Devices with Double-Layer Cathode", J. Kido, et al., IEEE Transactions on Electron Devices, vol. 40, No. 7, Jul. 1993, pp. 1342-1344.

The 10th International Workshop in Inorganic and Organic Electroluminescence (EL '00), Dec. 2000, pp. 297-300.

"Organic Electroluminescent Devices Having Metal Complexes as Cathode Interface Layer", J. Endo, et al., Jpn. J. Appln. Phys. vol. 41 (2002), pp. L800-L803.

"Organic Electroluminescent Devices Using Metal Complexes As an Electron Injection Layer", J. Kido, et al. IEEE Transactions on Electron Devices, 40, 1342 (1993), preprint 16a-YH-10, p. 1086.

"Thick Organic Electroluminescent Devices having Metal-Doped Electron-Injecting Layer", preprint 4p-N-6, p. 1079, no date.

* cited by examiner

ORGANIC ELECTROLUMINESCENT DEVICES

This application is a continuation of application Ser. No. 09/250,205 filed Feb. 16, 1999 now abandoned.

BACKGROUND OF THE INVENTION

1. Field of the Invention

The present invention relates to an organic electroluminescent device or element (hereinafter, also referred to as an "organic EL device") which can be advantageously, for example, utilized as a planar light source or in display devices.

2. Description of the Related Art

Attention has been made to an organic electroluminescent device having a luminescent layer, i.e., light-emitting layer, formed from the specific organic compound, because it ensures a large area display device with low-voltage driving. To obtain an EL device with a high efficiency, Tang et al., as is reported in Appl. Phys. Lett., 51, 913 (1987), have succeeded in providing an EL device having a structure in which organic compound layers having different carrier transporting properties are laminated to thereby introduce holes and electrons with a good balance from an anode and a cathode, respectively. In addition, since the thickness of the organic compound layers is less than or equal to 2,000 Å, the EL device can exhibit a high luminance and efficiency sufficient in practical use, that is, a luminance of about 1,000 $cd/M^2$ and an external quantum efficiency of about 1% at an applied voltage of not more than about 10 volts.

In the above-described high efficiency EL device, Tang et al. used a magnesium (Mg) having a low work function in combination with the organic compound which is basically considered to be an electrically insulating material, in order to reduce an energy barrier which can cause a problem during injection of electrons from a metal-made electrode. However, since the magnesium is liable to be oxidized and is instable, and also exhibits only a poor adhesion to a surface of the organic layers, magnesium was used after alloying, i.e., by the co-deposition of the same with silver (Ag) which is relatively stable and exhibits good adhesion to a surface of the organic layers.

On the other hand, the researchers of Toppan Printing Co. (cf, 51st periodical meeting, Society of Applied Physics, Preprint 28a-PB-4, p.1040) and those of Pioneer Co. (cf, 54th periodical meeting, Society of Applied Physics, Preprint 29p-ZC-15, p.1127) have had developments in the usage of lithium (Li), which has an even lower work function than that of Mg, and alloying the same with an aluminum (Al) to obtain a stabilized cathode, thereby embodying a lower driving voltage and a higher emitting luminance in comparison with those of the EL device using the Mg alloy. In addition, as is reported in IEEE Trans. Electron Devices., 40, 1342 (1993), the inventors of the present application have found that a two-layered cathode produced by depositing lithium (Li) alone with a very small thickness of about 10 Å on an organic compound layer, followed by laminating a silver (Ag) to the thus deposited Li layer is effective to attain a low driving voltage in the EL devices.

Recently, Pei et al. of Uniax Co. have proceeded to reduce a driving voltage of the EL device by doping a polymeric luminescent layer with a Li salt (cf. Science, 269, 1086 (1995)). This doping method is intended to dissociate the Li salt dispersed in the polymeric luminescent layer to distribute Li ions and counter ions near the cathode and near the anode, respectively, thus ensuring an in-situ doping of the polymer molecules positioned near the electrodes. According to this method, since the polymers near the cathode are reduced with Li as a donor dopant, i.e., electron-donating dopant, and thus the reduced polymers are contained in the state of radical anions, a barrier of the electron injection from the cathode can be remarkably reduced, contrary to the similar method including no Li doping.

More recently, the inventors of the present application have found that a driving voltage of the EL device can be reduced by doping an alkali metal such as lithium and the like, an alkali earth metal such as strontium and the like or a rare earth metal such as samarium and the like to an organic layer adjacent to the cathode electrode (cf. SID 97, Digest, P.775). It was believed that such reduction of the driving voltage could be obtained because a barrier in the electron injection from the cathode electrode can be notably reduced due to a radical anion state in the organic layer adjacent to the electrode produced by metal doping therein.

However, due to oxidation of the electrodes and other reasons, deterioration of the device can be resulted in the above-described EL devices using an alloy of Mg or Li as the electrode material. In addition, use of such alloy-made electrodes suffers from the limited selection of the material suitable for the electrodes, because the electrode material to be used has to simultaneously satisfy the requirement for the function as a wiring material. Further, the above-described two-layered cathode developed by the present inventors is unable to act as a cathode when a thickness of the Li layer is not less than about 20 Å (cf. IEEE Trans. Electron Devices., 40, 1342 (1993), and also suffers from a low reproducibility problem in the device production, because there is a difficulty in the control of the layer thickness, when the Li layer is deposited at a remarkably reduced thickness in the order of about 10 Å. Furthermore, in the in-situ doping method developed by Pei et al. in which the Li salt is added to the luminescent layer to cause their dissociation in the electric field, there is a problem with the transfer time of the dissociated ions to the close vicinity of the electrodes having a controlled velocity, thereby causing a remarkable retardation of the response speed of the devices.

Moreover, for the method including doping the metal as a dopant in the organic layer, there is a necessity to exactly control a concentration of the dopant during formation of the organic layer, because the doping concentration can affect on the properties of the resulting devices.

SUMMARY OF THE INVENTION

The present invention has been made to solve the above-described problems of the prior art EL devices, and accordingly one object of the present invention is to reduce an energy barrier in the electron injection of from a cathode electrode to an organic compound layer in accordance with the simple and reliable method, thereby ensuring a low-voltage driving regardless of the work function of the cathode material.

Another object of the present invention is to provide a device (organic electroluminescent device) capable of ensuring satisfactory characteristics which are similar to or higher than those obtained using the above-described alloy as the electrode material, when aluminum or other low-cost and stable metals which are conventionally used as the wiring material in the prior art are used alone as the cathode material.

According to the present invention, the above objects can be accomplished by an organic electroluminescent (EL) device comprising:
at least one luminescent layer constituted from an organic compound, the luminescent layer being positioned between a cathode electrode and an anode electrode opposed to the cathode electrode; and
an organic layer positioned adjacent to the cathode electrode,
in which the organic layer is constituted from an organic metal complex compound containing at least one member selected from the group consisting of an alkali metal ion, an alkali earth metal ion and a rare earth metal ion, and
the cathode electrode comprises a metal capable of reducing the metal ion contained in the complex compound, in vacuum, to the corresponding metal.

The metal used in the formation of the cathode electrode is not restricted to the specific one, insofar as it can reduce the metal ion contained in the organic metal complex compound constituting the organic layer, in vacuum, to the corresponding metal, and preferably the metal includes, for example, aluminum (Al), zirconium (Zr), titanium (Ti), yttrium (Y), scandium (Sc) and silicon (Si). These metals may be used alone in the formation of the cathode electrode, or alternatively their alloy containing one metal or two or more metals of the above-described Al, Zr, Ti, Y, Sc and Si may be used.

The above-described cathode metals and alloys thereof have a high melting point and, under the vacuum conditions, they can act to reduce a metal ion in the organic metal complex compound to the corresponding metal.

It is well-known that generally, some of alkali metals, alkali earth metals and rare earth metals can exhibit a higher saturated vapour pressure than that of the high melting point metals such as aluminum, and therefore any compounds containing such alkali metals or the like can be reduced with the high melting point metals such as aluminum, silicon, zirconium and the like. For example, it is well-known that calcium oxide can be reduced with aluminum to form a liberated metal calcium (cf. Chemical Handbook, "Applied Chemistry Section I"; edited by the Chemical Society of Japan, Maruzen Co., p.369), and rubidium oxide and strontium oxide (cf. Metal Handbook, edited by the Japan Institute of Metals, Maruzen Co., pp.88-89) can be also reduced with aluminum to form a liberated metal rubidium and strontium, respectively.

The production of metal electrodes in the organic EL devices is carried out in a vacuum of not more than $10^{-5}$ Torr to deposit an atomic metal on a substrate upon melting and volatilization of the metal. Therefore, when a thermally reducible metal such as aluminum, silicon, zirconium and the like in an atomic state is applied onto the alkali metals, alkali earth metals or rare earth metals, the above-described reduction reaction in vacuum is resulted to produce a reduced and liberated metal from the corresponding metal compounds. In this reduction process, if the compound used is an organic metal compound (metal complex), the compound itself can be doped (reduced) by the liberated metal, or, if a layer of the compound is thin and has a thickness of not more than 100 Å, the liberated metal can act on the adjacent layer of the organic compound, thereby reducing organic compounds in an interfacial area between the two adjacent layers with its strong reduction power.

If the alkali metal, alkali earth metal or rare earth metal compounds to be reduced are inorganic compounds such as oxides, fluorides and the like thereof, it is sometimes difficult to deposit their metal onto an organic layer, because the inorganic compounds have a high evaporation temperature due to their good stability. Further, due to their high electrical insulation property, the inorganic compounds can be deposited only at a highly restricted layer thickness of at most 20 Å (cf. IEEE Trans. Electron Devices., 44, 1245 (1997).

That is, the present invention is based on the above findings, and, to reduce an evaporation temperature and at the same time, to obtain a good layer formation property, the alkali metal, alkali earth metal or rare earth metal compounds in the form of an organic metal complex are used in place of the inorganic compounds. Further, selection and use of a suitable ligand compound as the organic metal complex enables to give a carrier transportation property including electron transportation property and hole transportation property to the resulting devices, thereby providing an advantage that a limitation concerning the thickness of the metal compound layer itself can be moderated in comparison with use of the inorganic compounds.

As described above, according to the present invention, an organic layer (electron injection layer) adjacent to the cathode electrode is constituted from an organic metal complex compound containing at least one ion selected from the group consisting of an alkali metal ion, an alkali earth metal ion and a rare earth metal ion, and at the same time, a metal capable of reducing in vacuum the metal ion contained in the metal complex compound which is a material constituting the organic layer is used as the electrode material in the formation of the cathode electrode. Thus, according to the present invention, because of the high reducing power of the cathode metal in vacuum, a metal of the organic metal complex compound of the organic layer is liberated, and then an organic compound is reduced with the liberated metal. The present inventors have thus succeeded to diminish an electron injection barrier, thereby reducing a driving voltage of the devices.

In the practice of the present invention, the organic metal complex compound used in the formation of the organic layer adjacent to the cathode metal is not restricted to the specific one, insofar as it contains, as a metal ion thereof, at least one metal ion of the alkali metal ions, alkali earth metal ions and rare earth metal ions. As the ligand compound for the metal complex compound, although they are not restricted to the below-described, quinolinol, benzoquinolinol, acrydinol, phenanethridinol, hydroxyphenyloxazole, hydroxyphenylthiazole, hydroxydiaryloxadiazole, hydroxydiaryldiazole, hydroxyphenylpyridine, hydroxyphenylbenzoimidazole, hydroxybenzotriazole, hydroxyfurborane, bipyridyl, phenanethroline, phthalocyanine, porphyrin, cyclopentadiene, β-diketones, azomethines and derivatives thereof can be preferably used.

The present disclosure relates to the subject matter contained in Japanese Patent Application No.10-34599 (filed on Feb. 17, 1998) which is expressly incorporated herein by reference in its entirety.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

The present invention will be further described with reference to the preferred embodiments thereof.

Figure 1:
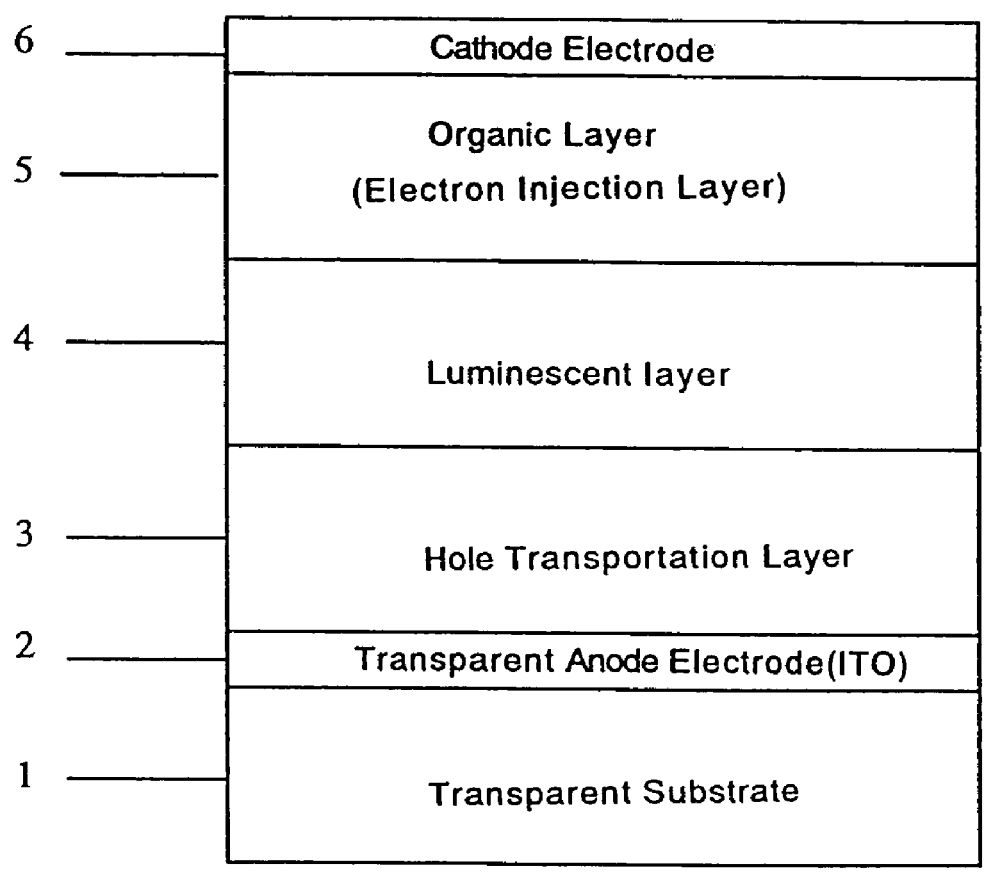
FIG. 1 is a cross-sectional view illustrating a lamination structure of the organic EL device according one preferred embodiment of the present invention.

FIG. 1 is a simplified cross-sectional view illustrating the organic EL device according one preferred embodiment of the present invention. A glass substrate (transparent substrate) 1 has, laminated in the following order on a surface thereof, a transparent electrode 2 constituting an anode electrode, a hole transportation layer 3 having a hole-transporting property, a luminescent layer 4, an organic layer 5 and a back electrode 6 constituting a cathode electrode. Among these components (layers) of the device, the glass substrate (transparent substrate) 1, the transparent electrode 2, the hole transportation layer 3, and the luminescent layer 4 are the well-known components, and the organic layer 5 and the back electrode 6 each has specific features suggested by the present invention.

In addition to the illustrated lamination structure of the layers, the organic EL device of the present invention may include other lamination structures such as anode/luminescent layer/organic layer/cathode, anode/hole transportation layer/luminescent layer/organic layer/cathode, anode/hole transportation layer/luminescent layer/electron transportation layer/organic layer/cathode, anode/hole injection layer/luminescent layer/organic layer/cathode, anode/hole injection layer/hole transportation layer/luminescent layer/organic layer/cathode, anode/hole injection layer/hole transportation layer/luminescent layer/electron transportation layer/organic layer/cathode, and others. For the organic EL device of the present invention, it may have any desired lamination structure, as long as a combination of the organic layer 5 and the cathode electrode 6 both included therein can satisfy the above-described requirements of the present invention.

The formation of the organic layer 5 may be carried out by using any desired methods for forming thin films including, for example, a vapour deposition method and a sputtering method. In addition to these methods, if its layer can be formed from a coating solution, the organic layer 5 may be formed from the coating solution by using any desired coating methods such as a spin coating method and a dip coating method.

Further, the formation of the cathode electrode 6 may be carried out by using the vapour deposition method and the sputtering method, however, any other methods may be used, if desired, as long as such methods are based on the film formation in vacuum.

In the production of the organic EL device of the present invention, the organic compounds which can be used in the formation of the luminescent layer and the electron transportation layer are not restricted to the specific compounds. Typical examples of suitable organic compounds include polycyclic compounds such as p-terphenyl and quaterphenyl as well as derivatives thereof; condensed polycyclic hydrocarbon compounds such as naphthalene, tetracene, pyrene, coronene, chrysene, anthracene, diphenylanthracene, naphthacene and phenanthrene as well as derivatives thereof; condensed heterocyclic compounds such as phenanthroline, bathophenanthroline, phenanthridine, acridine, quinoline, quinoxaline, phenazine and the like as well as derivatives thereof; and fluoresceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone and rubrene as well as derivatives thereof.

In addition to these compounds, metal-chelated complex compounds described in Japanese Unexamined Patent Publication (Kokai) Nos.63-295695, 8-22557, 8-81472, 5-9470 and 5-17764 can be suitably used as the organic compounds. Among these metal-chelated complex compounds, metal-chelated oxanoide compounds, for example, metal complexes which contain, as a ligand thereof, at least one member selected from 8-quinolinolato such as tris(8-quinolinolato)aluminum, bis(8-quinolinolato)magnesium, bis[benzo(f)-8-quinolinolato]zinc, bis(2-methyl-8-quinolinolato)aluminum, tri(8-quinolinolato)indium, tris(5-methyl-8-quinolinolato)aluminum, 8-quinolinolatolithium, tris(5-chloro-8-quinolinolato)gallium and bis(5-chloro-8-quinolinolato)calcium as well as derivatives thereof can be particularly suitably used.

Also, oxadiazoles disclosed in Japanese Patent Kokai Nos.5-202011, 7-179394, 7-278124 and 7-228579, triazines disclosed in Japanese Patent Kokai No.7-157473, stilbene derivatives and distyrylarylene derivatives disclosed in Japanese Patent Kokai No.6-203963, styryl derivatives disclosed in Japanese Patent Kokai Nos.6-132080 and 6-88072, and diolefin derivatives disclosed in Japanese Patent Kokai Nos.6-100857 and 6-207170 are preferably used in the formation of the luminescent layer and the electron transportation layer.

Further, a fluorescent whitening agent such as benzoxazoles, benzothiazoles and benzoimidazoles may be used as the organic compounds, and it includes, for example, those described in Japanese Patent Kokai No.59-194393. Typical examples of the fluorescent whitening agent include the fluorescent whitening agents classified under the group of benzoxazoles such as 2,5-bis(5,7-di-t-pentyl-2-benzoxazolyl)-1,3,4-thiadiazole, 4,4'-bis(5,7-t-pentyl-2-benzoxazolyl)stilbene, 4,4'-bis[5,7-di(2-methyl-2-butyl)-2-benzoxazolyl]stilbene, 2,5-bis(5,7-di-t-pentyl-2-benzoxazolyl)thiophene, 2,5-bis[5-(α, α-dimethylbenzyl)-2-benzoxazolyl]thiophene, 2,5-bis[5,7-di(2-methyl-2-butyl)-2-benzoxazolyl]-3,4-diphenylthiophene, 2,5-bis(5-methyl-2-benzoxazolyl)thiophene, 4,4'-bis(2-benzoxazolyl)biphenyl, 5-methyl-2-{2-[4-(5-methyl-2-benzoxazolyl)phenyl]vinyl} benzoxazole and 2-[2-(4-chlorophenyl)vinyl]naphtho(1,2-d)oxazole; under the group of benzothiazoles such as 2,2'-(p-phenylenedipynylene)-bisbenzothiazole; and under the group of benzoimidazoles such as 2-{2-[4-(2-benzoimidazolyl)phenyl]vinyl} benzoimidazole and 2-[2-(4-carboxyphenyl)vinyl]benzoimidazole.

As the distyrylbenzene compound, the compounds disclosed in European Patent No.373,582 may be used, for example. Typical examples of the distyrylbenzene compound include 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene and 1,4-bis(2-methylstyryl)-2-ethylbenzene.

Furthermore, distyrylpyrazine derivatives disclosed in Japanese Patent Kokai No.2-252793 may also be used in the formation of the luminescent layer and the electron transportation layer. Typical examples of the distyrylpyrazine derivatives include 2,5-bis(4-methylstyryl) pyrazine, 2,5-bis (4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine and 2,5-bis[2-(1-pyrenyl)vinyl]pyrazine.

In addition, dimethylidine derivatives disclosed in European Patent No.388,768 and Japanese Patent Kokai No.3-231970 may also be used as the material of the luminescent layer and the electron transportation layer. Typical examples of the dimethylidine derivatives include 1,4-phenylenedimethylidine, 4,4'-phenylenedimethylidine, 2,5-xylylenedimethylidine, 2,6-naphthylenedimethylidine, 1,4-biphenylenedimethylidine, 1,4-p-terephenylenedimethylidine, 9,10-anthracenediyldimethylidine, 4,4'-(2,2-di-t-butylphenyl vinyl)biphenyl and 4,4'-(2,2-diphenylvinyl)biphenyl as well as derivatives thereof; silanamine derivatives disclosed in Japanese Patent Kokai Nos.6-49079 and 6-293778; polyfunctional styryl compounds disclosed in Japanese Patent Kokai Nos.6-279322 and 6-279323; oxadiazole derivatives disclosed in Japanese Patent Kokai Nos.6-107648 and 6-92947; anthracene compounds disclosed in Japanese Patent Kokai No.6-206865; oxynate derivatives disclosed in Japanese Patent Kokai No.6-145146; tetraphenylbutadiene compounds disclosed in Japanese Patent Kokai No.4-96990; and organic trifunctional compounds disclosed in Japanese Patent Kokai No.3-296595; as well as coumarin derivatives disclosed in Japanese Patent Kokai No.2-191694; perylene derivatives disclosed in Japanese Patent Kokai No.2-196885; naphthalene derivatives disclosed in Japanese Patent Kokai No.2-255789; phthaloperynone derivatives disclosed in Japanese Patent Kokai Nos.2-289676 and 2-88689; and styrylamine derivatives disclosed in Japanese Patent Kokai No.2-250292.

Moreover, in the production of the organic EL device of the present invention, any well-known compounds which are conventional in the production of the prior art organic EL devices may be suitably used, if desired.

The arylamine compounds used in the formation of the hole injection layer, the hole transportation layer and the hole-transporting luminescent layer, although they are not restricted to, preferably include those disclosed in Japanese Patent Kokai Nos.6-25659, 6-203963, 6-215874, 7-145116, 7-224012, 7-157473, 8-48656, 7-126226, 7-188130, 8-40995, 8-40996, 8-40997, 7-126225, 7-101911 and 7-97355. Typical examples of suitable arylamine compounds include, for example, N,N,N',N'-tetraphenyl-4,4'-diaminophenyl, N,N'-diphenyl-N,N'-di(3-methylphenyl)-4, 4'-diaminobiphenyl, 2,2-bis(4-di-p-tolylaminophenyl) propane, N,N,N',N'-tetra-p-tolyl-4,4'-diaminobiphenyl, bis (4-di-p-tolylaminophenyl)phenylmethane, N,N'-diphenyl-N,N'-di(4-methoxyphenyl)-4,4'-diaminobiphenyl, N,N,N', N'-tetraphenyl-4,4'-diaminodiphenylether, 4,4'-bis (diphenylamino)quadriphenyl, 4-N,N-diphenylamino-(2-diphenylvinyl)benzene, 3-methoxy-4'-N,N-diphenylaminostilbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri (p-tolyl)amine, 4-(di-p-tolylamino)-4'-[4-(di-p-tolylamino) styryl]stilbene, N, N,N',N'-tetraphenyl-4,4'-diaminobiphenyl N-phenylcarbazole, 4,4'-bis[N-(1-naphthyl)-N-phenylamino]biphenyl, 4,4"-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenyl, 4,4"-bis[N-(1-anthryl)-N-phenylamino] p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino) naphthalene, 2,6-bis[di-(1-naphthyl) amino]naphthalene, 2,6-bis[N-(1-naphthyl)-N-(2-naphthyl)amino]naphthalene, 4,4"-bis[N,N-di(2-naphthyl)amino]terphenyl, 4,4'-bis {N-phenyl-N-[4-(1-naphthyl)phenyl]amino} biphenyl, 4,4'-bis[N-phenyl-N-(2-pyrenyl)amino]biphenyl, 2,6-bis[N,N-di (2-naphthyl) amino]fluorene, 4,4"-bis(N,N-di-p-tolylamino) terphenyl and bis(N-1-naphthyl)(N-2-naphthyl)amine. Also, any well-known arylamine compounds which are conventional in the production of the prior art organic EL devices may be suitably used, if desired.

Further, in the formation of the hole injection layer, the hole transportation layer and the hole-transporting luminescent layer, a dispersion of the above-described organic compounds in a polymer or a polymerized product of such organic compounds may be used as the layer-forming layer. Also, so-called "π-conjugated polymers" such as polyparaphenylene vinylene and its derivatives, hole-transporting non-conjugated polymers, typically poly(N-vinylcarbazole), and σ-conjugated polymers of polysilanes may be used as the layer-forming material.

The material of the hole injection layer to be deposited over the ITO (indium-tin oxide) electrode is not restricted to the specific one, however, metal phthalocyanines such as copper phthalocyanine as well as non-metal phthalocyanines, carbon films and electrically conductive polymers such as polyanilines may be preferably used in the formation of the hole injection layer. Alternatively, the hole injection layer may be formed by reacting the above-described arylamine compounds with a Lewis acid as an oxidizing agent to generate radical cations.

As is appreciated from the above detailed descriptions and the appended working examples, according to the present invention, since an organic layer adjacent to the cathode is constituted from an organic metal complex compound containing at least one of the alkali metal ions, alkali earth metal ions and rare earth metal ions, and the cathode is constituted from a metal capable of reducing, in vacuum, the metal ion of the metal complex compound constituting the organic layer, it becomes possible to utilize low cost and stable metals, which are conventional as a wiring material in the prior art devices, as a cathode material in the production of the organic EL devices.

In addition to this remarkable advantage, according to the present invention, it becomes possible to produce the EL devices having a diminished electron injection barrier and a reduced driving voltage as well as a high efficiency and high luminance. Accordingly, the EL devices of the present invention can exhibit a high utility in practical use, and ensures their effective utilization as display devices, light sources and others.

EXAMPLES

The present invention will be further described with reference to the following examples, however, it should be noted that the present invention is not restricted by these examples.

In the following examples, vapour deposition of the organic compound and that of the metal each was carried out by using the vapour deposition apparatus "VPC-400" commercially available from Shinkuu Kikou Co. The thickness of the deposited layers was determined by using the profilometer "DekTak3ST" commercially available from Sloan Co.

Further, the characteristics of the organic EL device were determined by using the source meter 2400 commercially available from Keithley & Co. and the luminance meter BM-8 commercially available from Topcon Co. A DC voltage was stepwise applied at an increasing rate of one volt per 2 seconds to the EL device having an ITO anode and an aluminum (Al) cathode, and the luminance and the electric current were determined after one second had passed from the completion of each increase of the voltage. The EL spectrum was determined by using the optical multichannel analyzer PMA-10, commercially available from Hamamatsu Photonics Co., driven at a constant electric current.

Example 1

The organic EL device having the lamination structure illustrated in FIG. 1 was produced according to the present invention.

A glass substrate 1 was coated with an ITO (indium-tin oxide) layer having a sheet resistance of about 25Ω/□, commercially available as an electron beam deposition product from Sanyo Shinku Co., to form a transparent anode electrode 2. Alpha (α)-NPD having a hole transporting property, represented by the following formula (1), was deposited onto the ITO-coated glass substrate 1 under the vacuum vapour deposition conditions of about $10^{-6}$ Torr and about 2 Å/sec to form a hole transportation layer 3 having a thickness of about 500 Å.

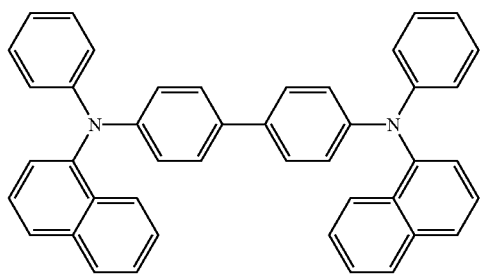

(1)

Next, an aluminum complex of tris(8-quinolinolato) (hereinafter, briefly referred to as "Alq") capable of exhibiting a green luminescence, represented by the following formula (2), was deposited onto the hole transportation layer 3 under the same vacuum vapour deposition conditions as in the above-described deposition of the hole transportation layer 3 to form a luminescent layer 4 having a thickness of about 700 Å.

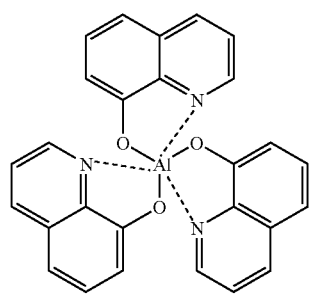

(2)

After the formation of the luminescent layer 4, a lithium complex of mono(8-quinolinolato) (briefly referred to as "Liq") represented by the following formula (3) was deposited under the pressure of about $10^{-6}$ Torr and at the deposition speed of about 1 Å/sec onto the layer 4 to form an organic layer (electron injection layer) 5 having a thickness of about 10 Å.

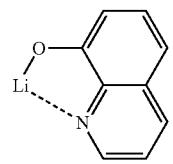

(3)

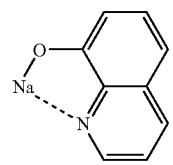

(4)

Finally, aluminum (Al) was deposited at the deposition speed of about 10 Å/sec onto the organic layer 5 to form a back electrode 6, acting as a cathode, having a thickness of about 1,000 Å. The organic EL device having a square luminescent area of about 0.5 cm (length) by about 0.5 cm (width) was thus obtained.

Figure 2:
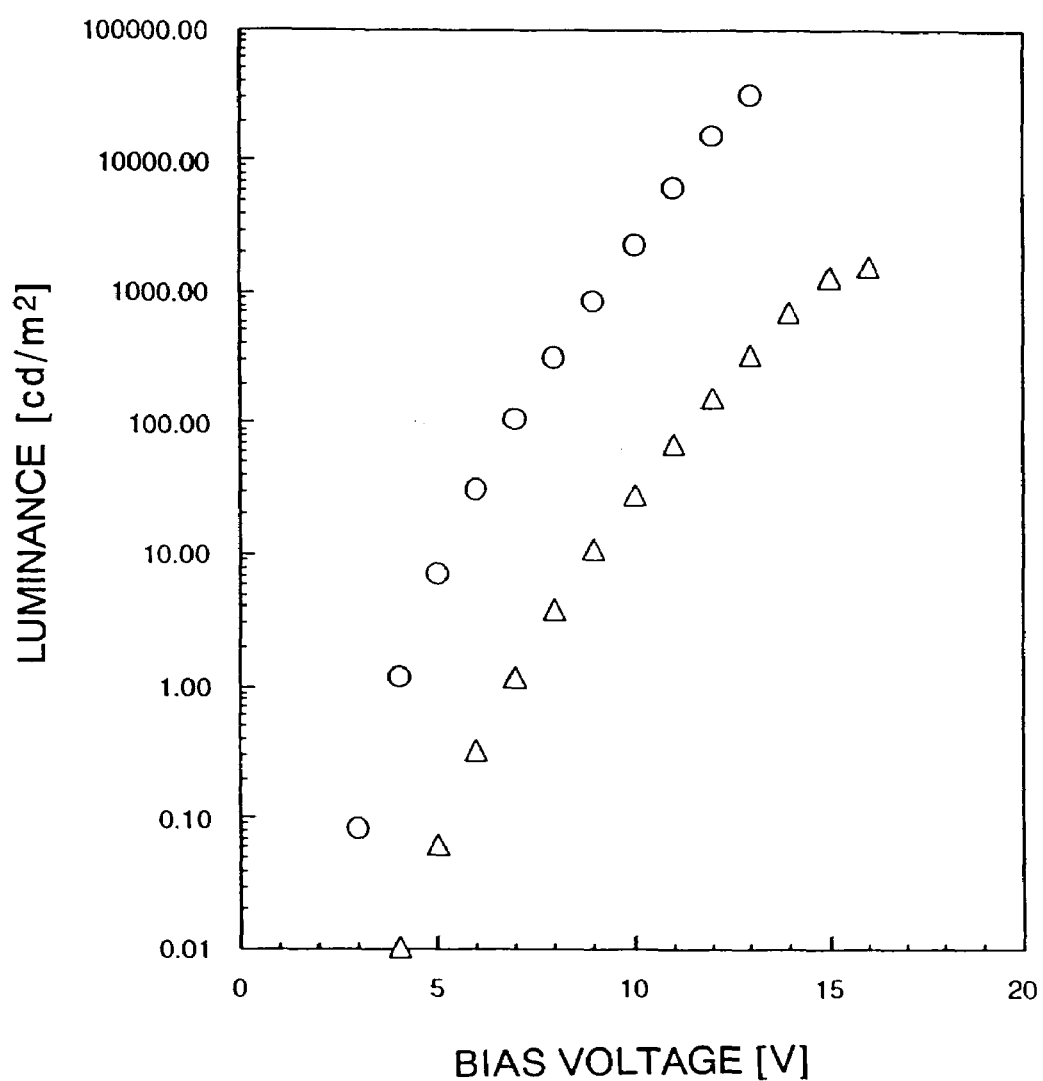
FIG. 2 is a graph showing the relationship between the bias voltage and the luminance for the organic EL device according the present invention and the comparative organic EL device.
Figure 3:
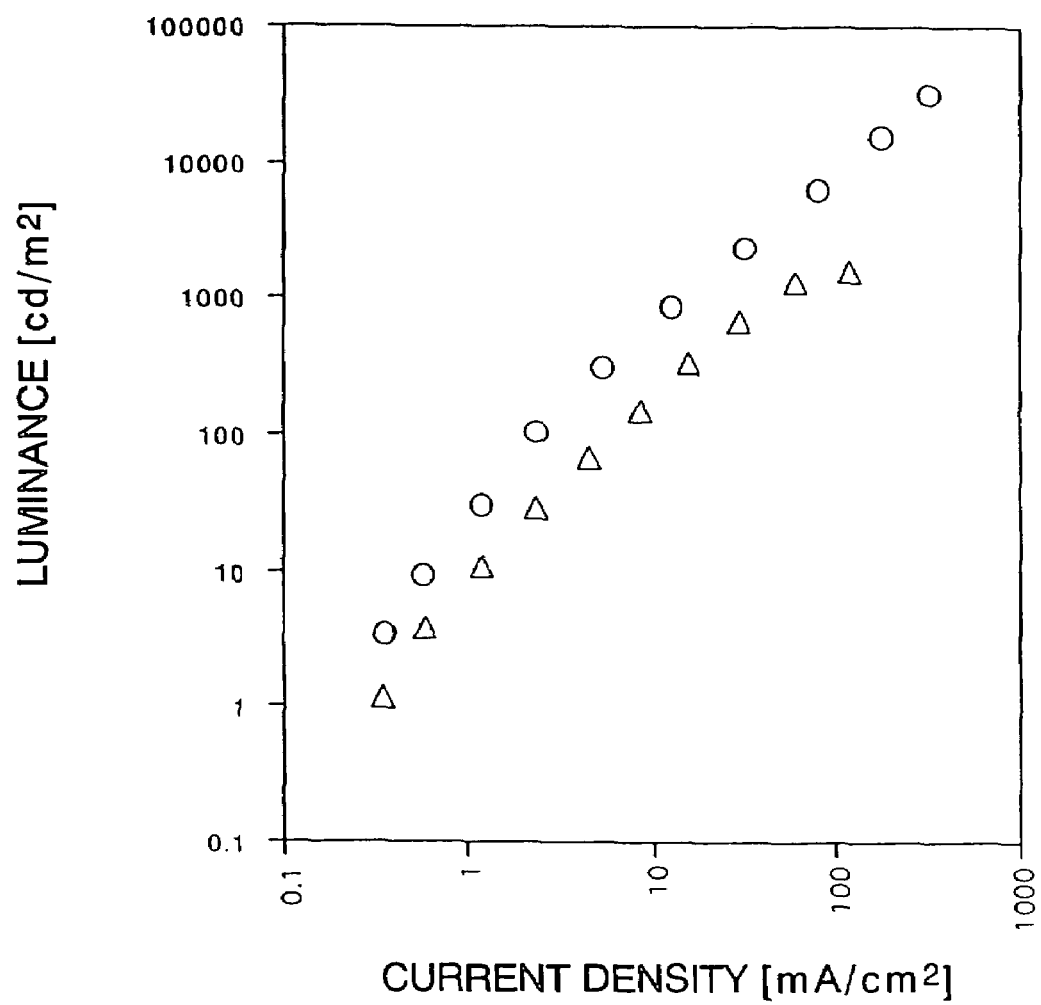
FIG. 3 is a graph showing the relationship between the current density and the luminance for the organic EL device according the present invention and the comparative organic EL device.

In the obtained organic EL device, a DC voltage was applied to between the anode electrode (ITO) 2 and the cathode electrode (Al) 6, and a luminance of the green luminescence from the luminescent layer (Alq) 4 was determined. The results were plotted with circles in each of FIG. 2 showing the relationship between the bias voltage and the luminance of the EL device and FIG. 3 showing the relationship between the current density and the luminance of the EL device. These results indicate that a high luminance of at most about 27,000 cd/m$^2$ could be obtained at the applied bias voltage of 14 volts. The current density was determined to be about 333 mA/cm$^2$. A luminance of about 1,000 cd/m$^2$ could be obtained at the applied bias voltage of about 8.5 volts.

Comparative Example 1

The procedure of Example 1 was repeated with the proviso that, for the purpose of comparison, an organic layer (electron injection layer) was omitted from the organic EL device. That is, α-NPD was first deposited onto the ITO-coated glass substrate to form a hole transportation layer having a thickness of about 500 Å, and then Alq was deposited under the same vacuum deposition conditions as in the deposition of the hole transportation layer to form a luminescent Alq layer having a thickness of about 700 Å. Then, aluminum (Al) was deposited at a thickness of about 1,000 Å over the luminescent Alq layer to form a cathode electrode. The organic EL device was thus obtained.

In the obtained organic EL device, the luminance of the green luminescence from the luminescent Alq layer was determined as in Example 1. The results were plotted with triangular marks in each of FIG. 2 and FIG. 3. These results indicate that only a luminance of at most about 1,600 cd/m$^2$ could be obtained at the applied bias voltage of 16 volts, and an application of the voltage of about 14.5 volts was required to obtain a luminance of 1,000 cd/m$^2$. It is appreciated from these results that the presence of the organic layer which is essential to the organic EL device of the present invention is effective to reduce the driving voltage of the EL device.

Example 2

The procedure of Example 1 was repeated with the proviso that in this example, α-NPD was first deposited onto the ITO-coated glass substrate 1 to form a hole transportation layer 3 having a thickness of about 500 Å, followed by vacuum deposition of Alq to form a luminescent layer 4 having a thickness of about 700 Å. Thereafter, a sodium complex of mono(8-quinolinolato) (briefly referred to as "Naq"), represented by the following formula (4), was deposited under the pressure of about $10^{-6}$ Torr and at the deposition speed of about 1 Å/sec onto the luminescent layer 4 to form an organic layer (electron injection layer) 5 having a thickness of about 10 Å.

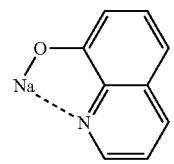

(4)

After the formation of the organic layer 5, aluminum (Al) was deposited at a thickness of about 1,000 Å over the organic layer 5 to form a cathode electrode 6. The organic EL device was thus obtained.

In the obtained organic EL device, a maximum luminance of about 31,500 cd/m² could be obtained at the applied bias voltage of 13 volts, along with the current density of about 319 mA/cm². That is, in this example, a highly increased luminance which is comparable to that of the above-described Example 1 could be obtained at a low driving voltage.

Example 3

The procedure of Example 1 was repeated with the proviso that in this example, α-NPD was first deposited onto the ITO-coated glass substrate 1 to form a hole transportation layer 3 having a thickness of about 500 Å, followed by vacuum deposition of Alq to form a luminescent layer 4 having a thickness of about 700 Å. Thereafter, a lithium complex of mono(2,2,6,6-tetramethyl-3,5-heptanediona to) (briefly referred to as "Li(dpm)"), represented by the following formula (5), was deposited under the pressure of about $10^{-6}$ Torr and at the deposition speed of about 1 Å/sec onto the luminescent layer 4 to form an organic layer (electron injection layer) 5 having a thickness of about 10 Å.

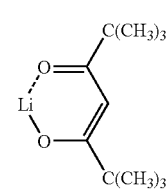

(5)

After the formation of the organic layer 5, aluminum (Al) was deposited at a thickness of about 1,000 Å over the organic layer 5 to form a cathode electrode 6. The organic EL device was thus obtained.

In the obtained organic EL device, a maximum luminance of about 18,000 cd/m² could be obtained at the applied bias voltage of 15 volts, along with the current density of about 327 mA/cm². That is, in this example, a highly increased luminance which is comparable to that of the above-described Example 1 could be obtained at a low driving voltage.

Example 4

The procedure of Example 1 was repeated with the proviso that in this example, α-NPD was first deposited onto the ITO-coated glass substrate 1 to form a hole transportation layer 3 having a thickness of about 500 Å, followed by vacuum deposition of Alq to form a luminescent layer 4 having a thickness of about 700 Å. Thereafter, a sodium complex of mono(2,2,6,6-tetramethyl-3,5-heptane-dionato) (briefly referred to as "Na(dpm)"), represented by the following formula (6), was deposited under the pressure of about $10^{-6}$ Torr and at the deposition speed of about 1 Å/sec onto the luminescent layer 4 to form an organic layer (electron injection layer) 5 having a thickness of about 10 Å.

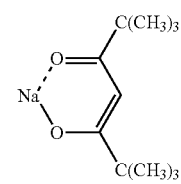

(6)

After the formation of the organic layer 5, aluminum (Al) was deposited at a thickness of about 1,000 Å over the organic layer 5 to form a cathode electrode 6. The organic EL device was thus obtained.

In the obtained organic EL device, a maximum luminance of about 21,000 cd/m² could be obtained at the applied bias voltage of 14 volts, along with the current density of about 433 mA/cm². That is, in this example, a highly increased luminance which is comparable to that of the above-described Example 1 could be obtained at a low driving voltage.

Example 5

The procedure of Example 1 was repeated with the proviso that in this example, α-NPD was first deposited onto the ITO-coated glass substrate 1 to form a hole transportation layer 3 having a thickness of about 500 Å, followed by vacuum deposition of Alq to form a luminescent layer 4 having a thickness of about 700 Å. Thereafter, a rubidium complex of mono(2,2,6,6-tetramethyl-3,5-heptane-dionato) (briefly referred to as "Rb(dpm)"), represented by the following formula (7), was deposited under the pressure of about $10^{-6}$ Torr and at the deposition speed of about 1 Å/sec onto the luminescent layer 4 to form an organic layer (electron injection layer) 5 having a thickness of about 10 Å.

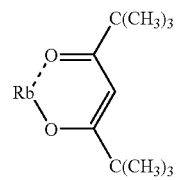

(7)

After the formation of the organic layer 5, aluminum (Al) was deposited at a thickness of about 1,000 Å over the organic layer 5 to form a cathode electrode 6. The organic EL device was thus obtained.

In the obtained organic EL device, a maximum luminance of about 25,000 cd/m² could be obtained at the applied bias voltage of 13 volts, along with the current density of about 504 mA/cm². That is, in this example, a highly increased luminance which is comparable to that of the above-described Example 1 could be obtained at a low driving voltage.

Example 6

The procedure of Example 1 was repeated with the proviso that in this example, α-NPD was first deposited onto the ITO-coated glass substrate 1 to form a hole transportation layer 3 having a thickness of about 500 Å, followed by vacuum deposition of Alq to form a luminescent layer 4 having a thickness of about 700 Å. Thereafter, a magnesium complex of di(2,2,6,6-tetramethyl-3,5-heptanediona to) (briefly referred to as "Mg(dpm)2"), represented by the following formula (8), was deposited under the pressure of about 10⁻⁶ Torr and at the deposition speed of about 1 Å/sec onto the luminescent layer 4 to form an organic layer (electron injection layer) 5 having a thickness of about 10 Å.

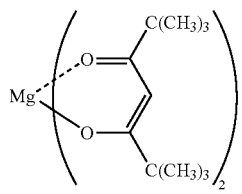

(8)

After the formation of the organic layer 5, aluminum (Al) was deposited at a thickness of about 1,000 Å over the organic layer 5 to form a cathode electrode 6. The organic EL device was thus obtained.

In the obtained organic EL device, a maximum luminance of about 3,400 cd/m² could be obtained at the applied bias voltage of 17 volts, along with the current density of about 120 mA/cm². That is, in this example, a highly increased luminance which is comparable to that of the above-described Example 1 could be obtained at a low driving voltage.

Example 7

The procedure of Example 1 was repeated with the proviso that in this example, α-NPD was first deposited onto the ITO-coated glass substrate 1 to form a hole transportation layer 3 having a thickness of about 500 Å, followed by vacuum deposition of Alq to form a luminescent layer 4 having a thickness of about 700 Å. Thereafter, a calcium complex of di(2,2,6,6-tetramethyl-3,5-heptanedionato) (briefly referred to as "Ca(dpm)2"), represented by the following formula (9), was deposited under the pressure of about 10⁻⁶ Torr and at the deposition speed of about 1 Å/sec onto the luminescent layer 4 to form an organic layer (electron injection layer) 5 having a thickness of about 10 Å.

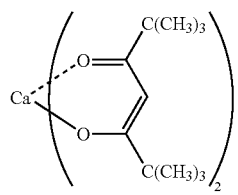

(9)

After the formation of the organic layer 5, aluminum (Al) was deposited at a thickness of about 1,000 Å over the organic layer 5 to form a cathode electrode 6. The organic EL device was thus obtained.

In the obtained organic EL device, a maximum luminance of about 14,300 cd/m² could be obtained at the applied bias voltage of 18 volts, along with the current density of about 168 mA/cm². That is, in this example, a highly increased luminance which is comparable to that of the above-described Example 1 could be obtained at a low driving voltage.

Example 8

The procedure of Example 1 was repeated with the proviso that in this example, α-NPD was first deposited onto the ITO-coated glass substrate 1 to form a hole transportation layer 3 having a thickness of about 500 Å, followed by vacuum deposition of Alq to form a luminescent layer 4 having a thickness of about 700 Å. Thereafter, an europium complex of tri(1,3-phenyl-1,3-propanedionato)mono (bathophenanthoroline) (briefly referred to as "Eu(dpm) 3.Bphen"), represented by the following formula (10), was deposited under the pressure of about 10⁻⁶ Torr and at the deposition speed of about 1 Å/sec onto the luminescent layer 4 to form an organic layer (electron injection layer) 5 having a thickness of about 10 Å.

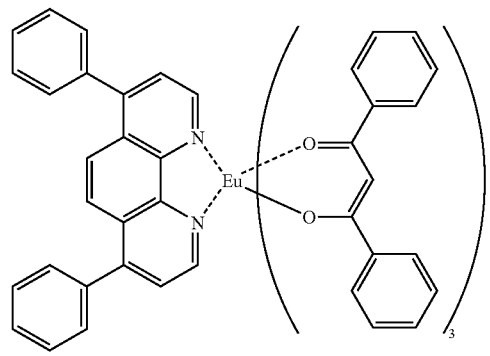

(10)

After the formation of the organic layer 5, aluminum (Al) was deposited at a thickness of about 1,000 Å over the organic layer 5 to form a cathode electrode 6. The organic EL device was thus obtained.

In the obtained organic EL device, a maximum luminance of about 12,000 cd/m² could be obtained at the applied bias voltage of 13 volts, along with the current density of about 230 mA/cm². That is, in this example, a highly increased luminance which is comparable to that of the above-described Example 1 could be obtained at a low driving voltage.

What is claimed is:

1. An organic electroluminescent device comprising:
at least one luminescent layer comprising an organic compound, said luminescent layer being positioned between a cathode electrode layer and an anode electrode layer opposed to said cathode electrode layer; and
an organic electron injection layer positioned adjacent to said cathode electrode layer,
wherein said organic electron injection layer comprises an organic metal complex compound containing at least one metal ion selected from an alkali metal ion, an alkaline earth metal ion and a rare earth metal ion, and
wherein said cathode electrode layer contains a metal selected from aluminum, zirconium, titanium, yttrium, scandium, or silicon, all of which metals have a capability of thermally reducing said at least one metal ion contained in said organic metal complex compound, in vacuum, and
wherein a metal is reduced from said at least one metal ion and is liberated from said organic metal complex compound; and
wherein said luminescent layer and said organic electron injection layer are not the same.

2. The organic electroluminescent device according to claim 1, in which the metal in said cathode electrode layer is aluminum.

3. The organic electroluminescent device according to claim 1, in which said organic electron injection layer has a thickness of about 10 Å.

4. The organic electroluminescent device according to claim 1, in which said metal which constitutes said cathode electrode layer is an alloy containing at least any one of aluminum, zirconium, titanium, yttrium, scandium, and silicon.

5. An organic electroluminescent device comprising:
at least one luminescent layer comprising an organic compound, said luminescent layer being positioned between a cathode electrode layer and an anode electrode layer opposed to said cathode electrode layer; and
an organic electron injection layer positioned adjacent to said cathode electrode layer,
wherein said organic electron injection layer comprises an organic metal complex compound containing at least one metal ion selected from an alkali metal ion, an alkaline earth metal ion and a rare earth metal ion, and
wherein said cathode electrode layer contains a metal selected from aluminum, zirconium, titanium, yttrium, scandium, or silicon, all of which metals have a capability of thermally reducing said at least one metal ion contained in said organic metal complex compound, in vacuum, and
wherein a metal is reduced from said at least one metal ion and is liberated from said organic metal complex compound; and
wherein said luminescent layer and said organic electron injection layer are not the same and wherein said organic electron injection layer has a thickness of about 10 Å.

6. An organic electroluminescent device comprising:
at least one luminescent layer comprising an organic compound, said luminescent layer being positioned between a cathode electrode layer and an anode electrode layer opposed to said cathode electrode layer; and
an organic electron injection layer positioned adjacent to said cathode electrode layer,
wherein said organic electron injection layer comprises an organic metal complex compound containing at least one metal ion selected from an alkali metal ion, an alkaline earth metal ion and a rare earth metal ion, and
wherein said cathode electrode layer contains a metal selected from aluminum, zirconium, titanium, yttrium, scandium, or silicon, all of which metals have a capability of thermally reducing said at least one metal ion contained in said organic metal complex compound, in vacuum, and
wherein a metal is reduced from said at least one metal ion and is liberated from said organic metal complex compound; and
wherein said luminescent layer and said organic electron injection layer are not the same and wherein said organic electron injection layer has a thickness of less than 100 Å.

7. An organic electroluminescent device comprising:
at least one luminescent layer comprising an organic compound, said luminescent layer being positioned between a cathode electrode layer and an anode electrode layer opposed to said cathode electrode layer; and
an organic electron injection layer positioned adjacent to said cathode electrode layer,
wherein said organic electron injection layer comprises an organic metal complex compound containing at least one metal ion selected from a sodium ion, a potassium ion, a rubidium ion, a cesium ion, a francium ion, a magnesium ion, a calcium ion, a strontium ion, a barium ion, a radium ion and a rare earth metal ion, and
wherein said cathode electrode layer contains a metal selected from aluminum, zirconium, titanium, yttrium, scandium, or silicon, all of which metals have a capability of thermally reducing said at least one metal ion contained in said organic metal complex compound, in vacuum, and
wherein a metal is reduced from the said at least one metal ion and is liberated from said organic metal complex compound; and
wherein said luminescent layer and said organic electron injection layer are not the same.

8. An organic electroluminescent device comprising:
at least one luminescent layer comprising an organic compound, said luminescent layer being positioned between a cathode electrode layer and an anode electrode layer opposed to said cathode electrode layer; and
an organic electron injection layer positioned adjacent to said cathode electrode layer,
wherein said organic electron injection layer comprises an organic metal complex compound containing at least one metal ion selected from an alkali metal ion, an alkaline earth metal ion and a rare earth metal ion, and
wherein said cathode electrode layer contains a metal selected from zirconium, scandium, or silicon, all of which metals have a capability of thermally reducing said at least one metal ion contained in said organic metal complex compound, in vacuum, and
wherein a metal is reduced from said at least one metal ion and is liberated from said organic metal complex compound; and
wherein said luminescent layer and said organic electron injection layer are not the same.

9. An organic electroluminescent device comprising:
at least one luminescent layer comprising an organic compound, said luminescent layer being positioned between a cathode electrode layer and an anode electrode layer opposed to said cathode electrode layer; and an organic electron injection layer positioned adjacent to said cathode electrode layer, wherein said organic electron injection layer comprises an organic metal complex compound containing at least one metal ion selected from an alkali metal ion, an alkaline earth metal ion and a rare earth metal ion, with the proviso that said organic metal complex compound excludes Liq (lithium 8-hydroxyquinolinate) and Beq (beryllium bis(10-hydroxybenzo[h]quinolinate)), and wherein said cathode electrode layer contains a metal selected from aluminum, zirconium, titanium, yttrium, scandium, or silicon, all of which metals have a capability of thermally reducing said at least one metal ion contained in said organic metal complex compound, in vacuum, and wherein a metal is reduced from said at least one metal ion and is liberated from said organic metal complex compound; and wherein said luminescent layer and said organic electron injection layer are not the same.

10. An organic electroluminescent device comprising:

at least one luminescent layer comprising an organic compound, said luminescent layer being positioned between a cathode electrode layer and an anode electrode layer opposed to said cathode electrode layer; and an organic electron injection layer positioned adjacent to said cathode electrode layer, wherein said organic electron injection layer comprises an organic metal complex compound containing at least one metal ion selected from a lithium ion and a beryllium ion, and wherein said cathode electrode layer contains a metal selected from aluminum, titanium, or yttrium, all of which metals have a capability of thermally reducing said at least one metal ion contained in said organic metal complex compound, in vacuum, and wherein a metal is reduced from said at least one metal ion and is liberated from said organic metal complex compound.

* * * * *